(12) United States Patent
Lin et al.

(10) Patent No.: US 11,756,608 B2
(45) Date of Patent: Sep. 12, 2023

(54) WRITE ASSIST CELL FOR STATIC RANDOM ACCESS MEMORY

(71) Applicant: Taiwan Semiconductor Manufacturing Company, Ltd., Hsinchu (TW)

(72) Inventors: Yangsyu Lin, New Taipei (TW); Po-Sheng Wang, Hsinchu (TW); Cheng Hung Lee, Hsinchu (TW); Jonathan Tsung-Yung Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 124 days.

(21) Appl. No.: 17/460,070

(22) Filed: Aug. 27, 2021

(65) Prior Publication Data
US 2023/0069721 A1 Mar. 2, 2023

(51) Int. Cl.
*G11C 11/419* (2006.01)
*G11C 11/412* (2006.01)
*H10B 10/00* (2023.01)

(52) U.S. Cl.
CPC .......... *G11C 11/419* (2013.01); *G11C 11/412* (2013.01); *H10B 10/12* (2023.02); *H10B 10/18* (2023.02)

(58) Field of Classification Search
CPC ..... G11C 11/412; G11C 11/419; H10B 10/12; H10B 10/18
USPC .......................................................... 365/154
See application file for complete search history.

(56) References Cited

U.S. PATENT DOCUMENTS

| | | | |
|---|---|---|---|
| 2010/0329044 A1* | 12/2010 | Yeung | G11C 8/16 365/189.16 |
| 2018/0301185 A1* | 10/2018 | Lin | G11C 11/419 |
| 2019/0066773 A1* | 2/2019 | Park | G11C 7/14 |
| 2019/0066774 A1* | 2/2019 | Singh | H01L 27/1211 |
| 2019/0237135 A1* | 8/2019 | Madhavan | G11C 11/419 |
| 2022/0148644 A1* | 5/2022 | Choi | G11C 11/412 |

\* cited by examiner

*Primary Examiner* — Sung Il Cho
(74) *Attorney, Agent, or Firm* — FOLEY & LARDNER LLP

(57) ABSTRACT

A memory device includes a memory array having a plurality of memory cells arranged along a plurality of rows extending in a row direction and a plurality of columns extending in a column direction. The memory array also includes a plurality of write assist cells connected to the plurality of memory cells. At least one write assist cell of the plurality of write assist cells is in each of the plurality of columns and connected to respective ones of the plurality of memory cells in a same column.

20 Claims, 12 Drawing Sheets

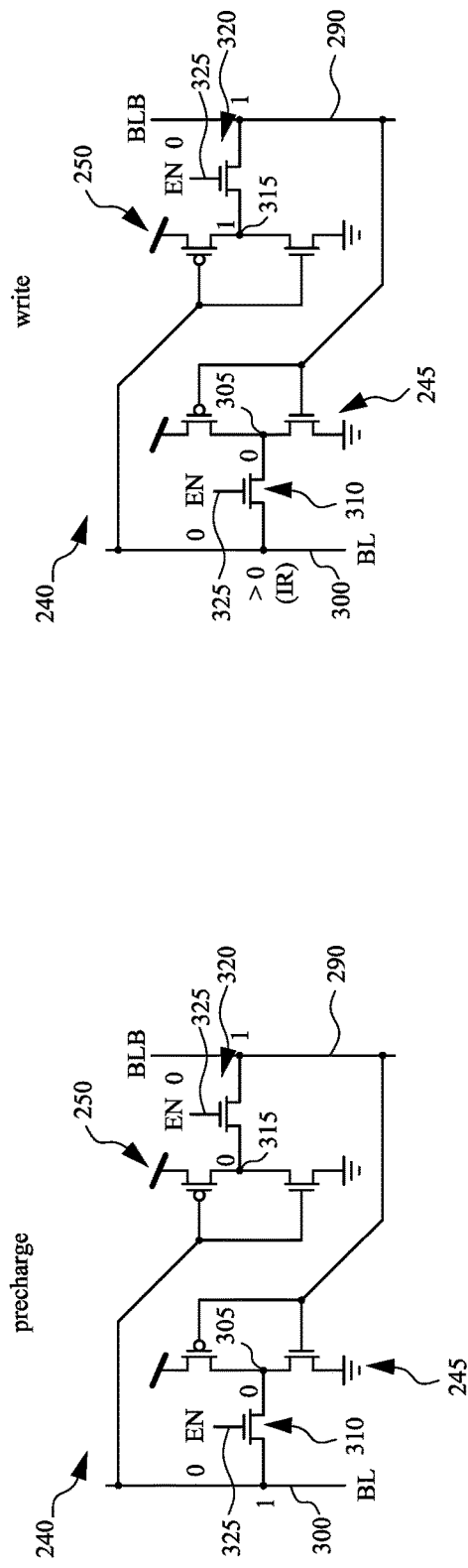
Fig. 5A
Fig. 5B
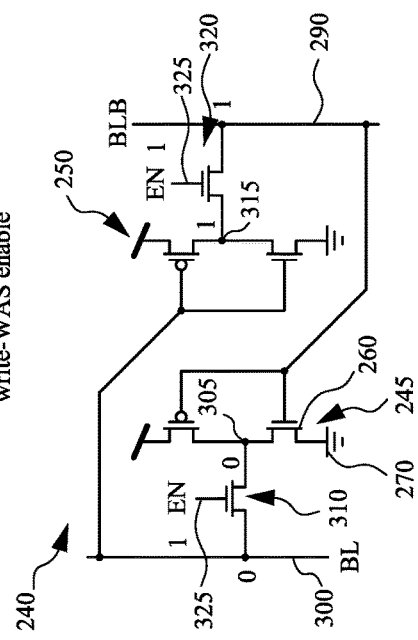
Fig. 5C

WRITE ASSIST CELL FOR STATIC RANDOM ACCESS MEMORY

BACKGROUND

The present disclosure relates generally to memory devices, and particularly to optimized static random-access memory cells.

Memory devices are used in a wide variety of applications. Memory devices are made up of a plurality of memory cells that are typically arranged in an array of a plurality of rows and a plurality of columns. One type of memory cell is a Static Random-Access Memory (SRAM) cell. In some applications, an SRAM cell-based memory device may be preferred over other types of memory cell-based memory devices due to faster speed and reduced power consumption of SRAM cells. As applications require more and more memory, the number of SRAM cells in a memory device is constantly increasing. Additionally, with rising demand for product diversification, co-operation between circuit design and semiconductor manufacturing of SRAM cells is becoming more and more crucial. However, present day SRAM memory cells have limitations in the way those memory cells are configured and how they operate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5E are circuit diagrams showing operation of the WAS cell of FIG. 3, in accordance with some embodiments.

DETAILED DESCRIPTION

Figure 1:
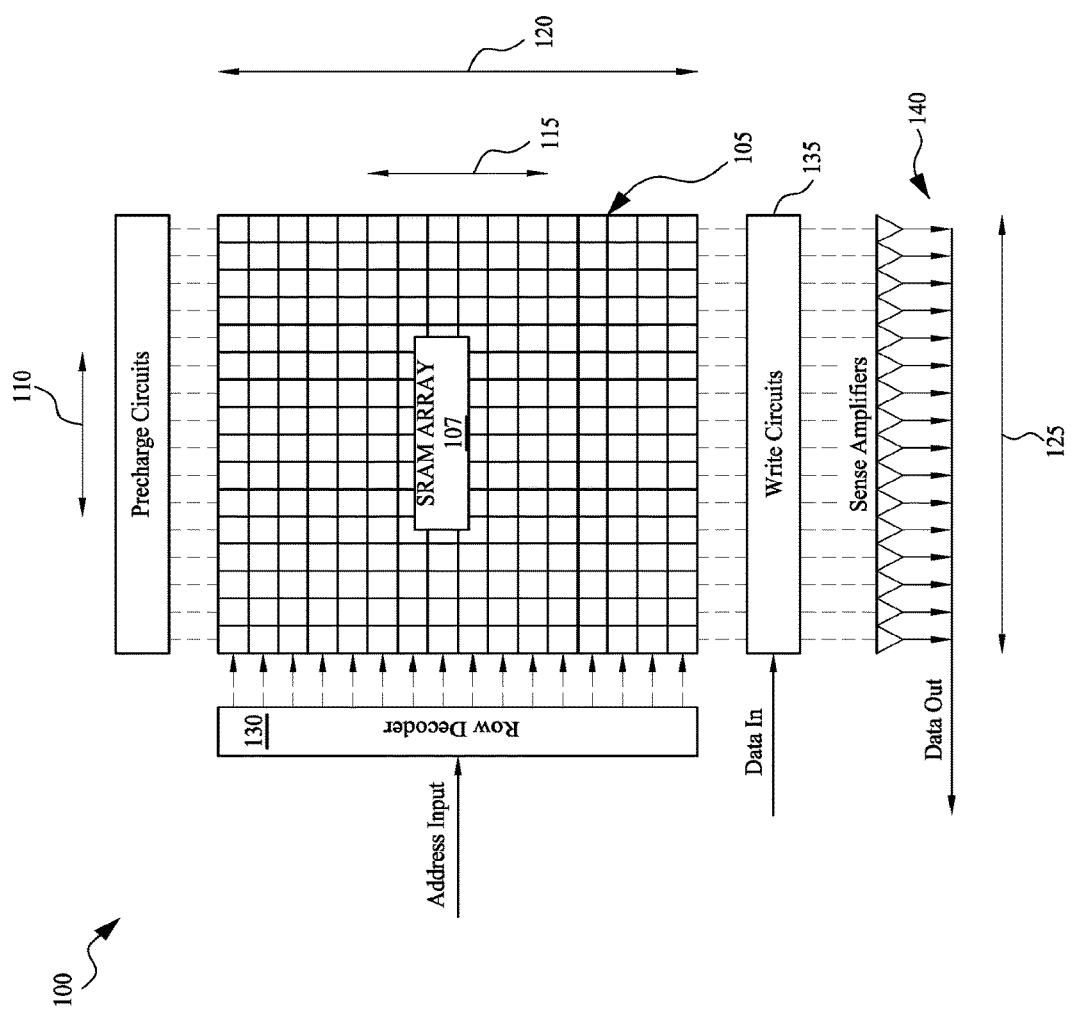
FIG. 1 is an example block diagram of a memory device having an SRAM array, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring now to FIG. 1, an example block diagram of a Static Random-Access Memory ("SRAM") device 100 is shown, in accordance with some embodiments of the present disclosure. The SRAM device 100 includes an SRAM array 105. The SRAM array 105 includes an arrangement of a plurality of SRAM cells and write assist ("WAS") cells 107 arranged in one or more rows that extend along an X-direction 110 (also referred to herein as a row direction or word line (WL) direction) and one or columns that extend in a Y-direction 115 (also referred to herein as a column direction or bit line (BL) direction). The number of rows and the number of columns in the SRAM array 105 may depend upon the size of the SRAM array. Generally speaking, larger the size of the SRAM array 105, greater is the number of rows and/or columns in the SRAM array. Depending upon the number of rows, the SRAM array 105 may have a height 120 in the Y-direction 115. Similarly, depending upon the number of columns, the SRAM array 105 may have a width 125 in the X-direction 110. Each of the plurality of SRAM cells and WAS cells 107 of the SRAM array 105 may also have a height that extends in the Y-direction 120 and a width that extends in the X-direction 110.

The SRAM device 100 may also include a row decoder 130 coupled to the SRAM array 105. Each SRAM cell of the SRAM array 105 may be connected to a word line that extends in the X-direction 110 and a bit line that extends in the Y-direction 115. For example, each SRAM cell in a particular row of the SRAM array 105 may be connected to the same word line and each SRAM cell in a particular column of the SRAM array may be connected to the same bit line. Thus, the SRAM array 105 may be coupled to a plurality of word lines and a plurality of bit lines. Each WAS cell may also be connected to the same bit line that is associated with the SRAM cells in a particular column. A "word line" is a conductive line through which a voltage signal of an appropriate voltage level may be applied to a particular SRAM cell to which the word line is connected to select the SRAM cell for either reading data from the SRAM cell or writing data to that SRAM cell. A "bit line" is a conductive line that reads the data from the SRAM cell when that SRAM cell has been selected by the word line or that provides the data to be written to the SRAM cell when that SRAM cell has been selected by the word line. Thus, the word line selects the SRAM cell before data can be read or written to that SRAM cell and the bit line provides the data read from or to be written to that SRAM cell.

The row decoder 130 may be used to select a particular word line of the SRAM array 105. For example, the row decoder 130 may receive an address input and convert that address input into an appropriate word line. In some embodiments, the row decoder 130 may be associated with additional or other types or circuits or elements that facilitate selection of a word line.

The SRAM device 100 may also include write circuits 135 and sense amplifiers 140, which may be used to read data from or provide data to write to a particular SRAM cell of the SRAM array 105 via a bit line. For example, in some embodiments, the data being read from the SRAM array 1-5 may be sensed by the sense amplifiers 140. In some embodiments, the data being written to the SRAM array 105 may be provided to the write circuits 135 for programming within the SRAM array. In some embodiments, the write circuits 135 and the sense amplifiers 140 may be associated with latches and/or other circuits that enable reading data from and writing data to a particular SRAM cell. In some embodiments, the write circuits 135, the sense amplifiers 140, and other associated circuits (e.g., write drivers) that receives the read data or provide the write data may be considered input/output circuits. The SRAM device 100 may additionally include a control block (not shown) that may be configured to control operation of the row decoder 130, the write circuits 135, the sense amplifiers 140, and any other circuits of the SRAM device 100. It is to be understood that only some components of the SRAM device 100 are shown in FIG. 1. Nevertheless, the SRAM device 100 is intended to include other components that are needed or considered desirable to have in operating the SRAM device and performing the functions described herein.

Figure 2:
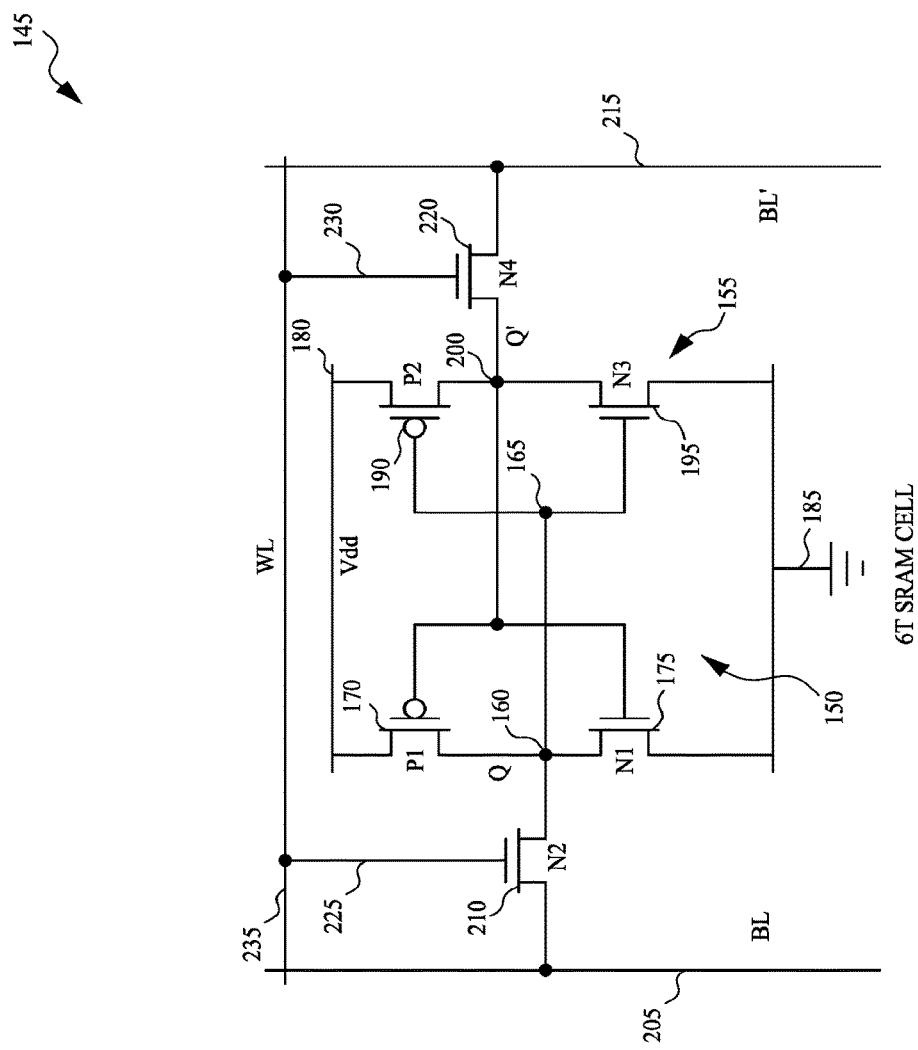
FIG. 2 is an example circuit diagram of an SRAM cell of the SRAM array of FIG. 1, in accordance with some embodiments.

FIG. 2 describes an SRAM cell 145 of the SRAM array 105 in greater detail. In some embodiments, the SRAM cell 145 may be a 6-transistor or 6T SRAM cell. A 6T SRAM cell (e.g., the SRAM cell 145) may include six transistors (e.g., metal-oxide-semiconductor (MOS) transistors) configured to store one bit of information. Specifically, the 6T SRAM cell may include two cross-coupled inverters 150 and 155 to form a latch circuit. By cross-coupling the inverters 150 and 155, an output node 160 of the inverter 150 may be connected to an input node 165 of the inverter 155 such that when one of the output nodes (e.g., the output node 160 or the output node of the inverter 155) is pulled to a low voltage level, the other output node transitions to a high voltage level.

The inverter 150 may include a p-type pull-up transistor 170 and an n-type pull-down transistor 175 connected between a supply voltage 180 (e.g., VDD, CVDD) and a ground voltage 185 (e.g., VSS, Negative VSS). The inverter 155 may similarly include a p-type pull-up transistor 190 and an n-type pull-down transistor 195 connected between the supply voltage 180 and the ground voltage 185. The output node 160 of the inverter 150 and an output node 200 of the inverter 155 serve as storage nodes (e.g., from where data stored in the SRAM cell 145 is read or where data written to the SRAM cell is written to). The output node 160 is coupled to a bit line 205 through a first access transistor 210 and the output node 200 is coupled to a bit line 215 through a second access transistor 220. The bit lines 205 and 215 are the same but complementary lines, or in other words, inverse of one another. Gate terminals 225 and 230 of the first access transistor 210 and the second access transistor 220, respectively, are connected to a word line 235.

The voltage level on the word line 235 turns ON and turns OFF the first access transistor 210 and the second access transistor 220 to allow or deny access to the output nodes 160, 200. When the first access transistor 210 and the second access transistor 220 are turned ON, the SRAM cell 145 is considered selected. For example, when the word line 235 is asserted (e.g., by applying appropriate voltage or switching to a high voltage level (e.g., VDD)), the first access transistor 210 and the second access transistor 220 are turned ON, allowing the output nodes 160 and 200 to be accessible to the bit lines 205 and 215, respectively. When the first access transistor 210 and the second access transistor 220 are turned ON, data stored at the output nodes 160 and 200 may be read through the bit lines 205 and 215, respectively. Similarly, when the first access transistor 210 and the second access transistor 220 are turned ON, data may be written to the output nodes 160 and 200 through the bit lines 205 and 215, respectively. When the word line 235 is de-asserted (e.g., by applying a low voltage level (e.g., Vss)), the first access transistor 210 and the second access transistor 220 are turned OFF and the output nodes 160 and 200 are disconnected from the bit lines 205 and 215, respectively. Thus, by adjusting the voltage level at the word line 235, data may be stored at or read from the output nodes 160 and 200.

Although the SRAM cell 145 is described herein as a 6T SRAM cell, in other embodiments, the SRAM cell 145 may assume other configurations. For example, in some embodiments, the SRAM cell 145 and other SRAM cells of the SRAM array 105 may be a 4T SRAM cell, 8T SRAM cell, 10T SRAM cell, 12T SRAM cell, etc. In other embodiments, the SRAM cell 145 and the other SRAM cells of the SRAM array 105 may assume any other configuration that is deemed suitable.

Figure 3:
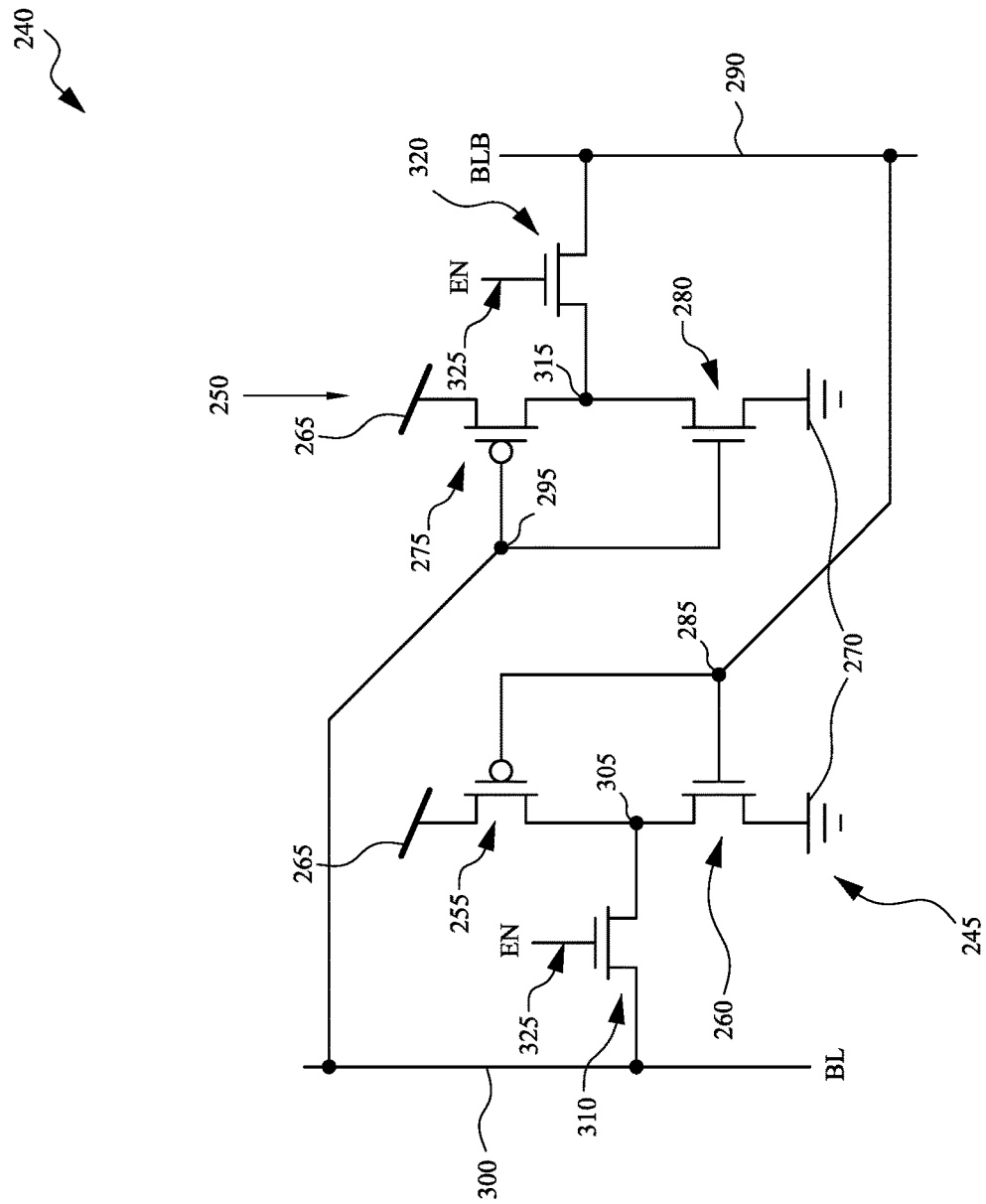
FIG. 3 is an example circuit diagram of a Write Assist (WAS) cell of the SRAM array of FIG. 1, in accordance with some embodiments.

FIG. 3 describes an example circuit diagram for a write assist ("WAS") cell 240, in accordance with some embodiments of the present disclosure. The write assist cell 240 may be used for increasing/maintaining bit line voltages in the bit lines 205 and 215. Specifically, as sizes of memory cells shrink, the operating voltages of those memory cells are also reduced, thereby reducing the read and write voltage margins in SRAM cells. The read and write voltage margins measure how reliably data may be read from or written into an SRAM cell. Further, bit lines experience voltage drop (e.g., current-resistance drop or IR drop) due to current (I) flowing through those bit lines, as well as the metal resistance (R) and capacitance. As the size of the SRAM cell shrinks, the bit lines 205 and 215 become thinner and narrower, further increasing the IR drop experienced by those bit lines. Additionally, depending upon the number of rows in the SRAM array 105, the SRAM cells that are farther away from the input/output circuits (e.g., farther away from the write driver, which charge the bit lines 205 and 215) experience a greater IR drop than SRAM cells that are closer to those input/output circuits. The increased overall IR drop may further reduce the read and write margins in the SRAM cells. Reduced read and write margin may reduce the speed of read and write operations, respectively. In some embodiments, depending upon how low the read and write margins may be, certain read and write operations may even fail. The WAS cell 240 increases, amplifies, or maintains the bit line voltages on the bit lines 205 and 215, thereby increasing the read and write margins and ensuring reliability of read and write operations, respectively. For example, in some embodiments, the WAS cell 240 may be configured to maintain the bit line voltage of the bit line 205 at or about a logic low voltage level (e.g., 0V).

The WAS cell 240 may include six transistors (e.g., metal-oxide-semiconductor (MOS) transistors) similar to the SRAM cell 145. While the SRAM cell 145 is configured to store data, the WAS cell 240 is not configured to store data. Rather, the WAS cell 240 is configured to provide appropriate bit line voltages to the bit lines 205 and 215 during a read operation and a write operation of the SRAM cell 145. The WAS cell 240 may include two inverters 245 and 250. The inverter 245 may include a first transistor 255 and a second transistor 260 connected between a supply voltage 265 (e.g., VDD, CVDD) and a ground voltage 270 (e.g., VSS or Negative VSS (e.g., NVSS)). The inverter 250 may similarly include a first transistor 275 and a second transistor 280 connected between the supply voltage 265 and the ground voltage 270. In some embodiments, each of the first transistors 255 and 275 may be p-type transistor and each of the second transistors 260 and 280 may be n-type transistors. In other embodiments, either or both of the first transistors 255 and 275 may be n-type transistor and/or either or both of the second transistors 260 and 280 may be p-type transistors.

An input node 285 of the inverter 245 may be coupled to a bit line 290 and an input node 295 of the inverter 250 may be coupled to a bit line 300. The bit line 290 is similar to the bit line 215 and the bit line 300 is similar to the bit line 205. In some embodiments, the same bit line (e.g., the bit line 290 and 215) may be connected to both an SRAM cell and a WAS cell. Similarly, in some embodiments, the same bit line (e.g., the bit line 300 and 205) may be connected to both the SRAM cell and the WAS cell. Further, an output node 305 of the inverter 245 may be coupled to the bit line 300 through a first access transistor 310 and an output node 315 of the inverter 250 may be coupled to the bit line 290 through a second access transistor 320. Thus, the input node (e.g., the input nodes 285, 295) of each of the inverters 245 and 250 may be connected to one bit line (e.g., the bit lines 290, 300), while the output node (e.g., the output node 305, 315) of each of those inverters may be connected to the other bit line (e.g., the bit lines 300, 290). The first access transistor 310 and the second access transistor 320 may also be connected to an enable signal 325. The enable signal 325 may be used to turn ON and turn OFF the first access transistor 310 and the second access transistor 320. Thus, a single enable signal (e.g., the enable signal 325) may be used to control operation of the WAS cell 240, without needing any complex control mechanism that is often required in conventional WAS circuits. In some embodiments, each of the first access transistor 310 and the second access transistor 320 is an n-type transistor. In other embodiments, either or both of the first access transistor 310 and the second access transistor 320 may be a p-type transistor. The operation of the WAS cell 240 is described in FIGS. 5A-5E below.

Figure 4:
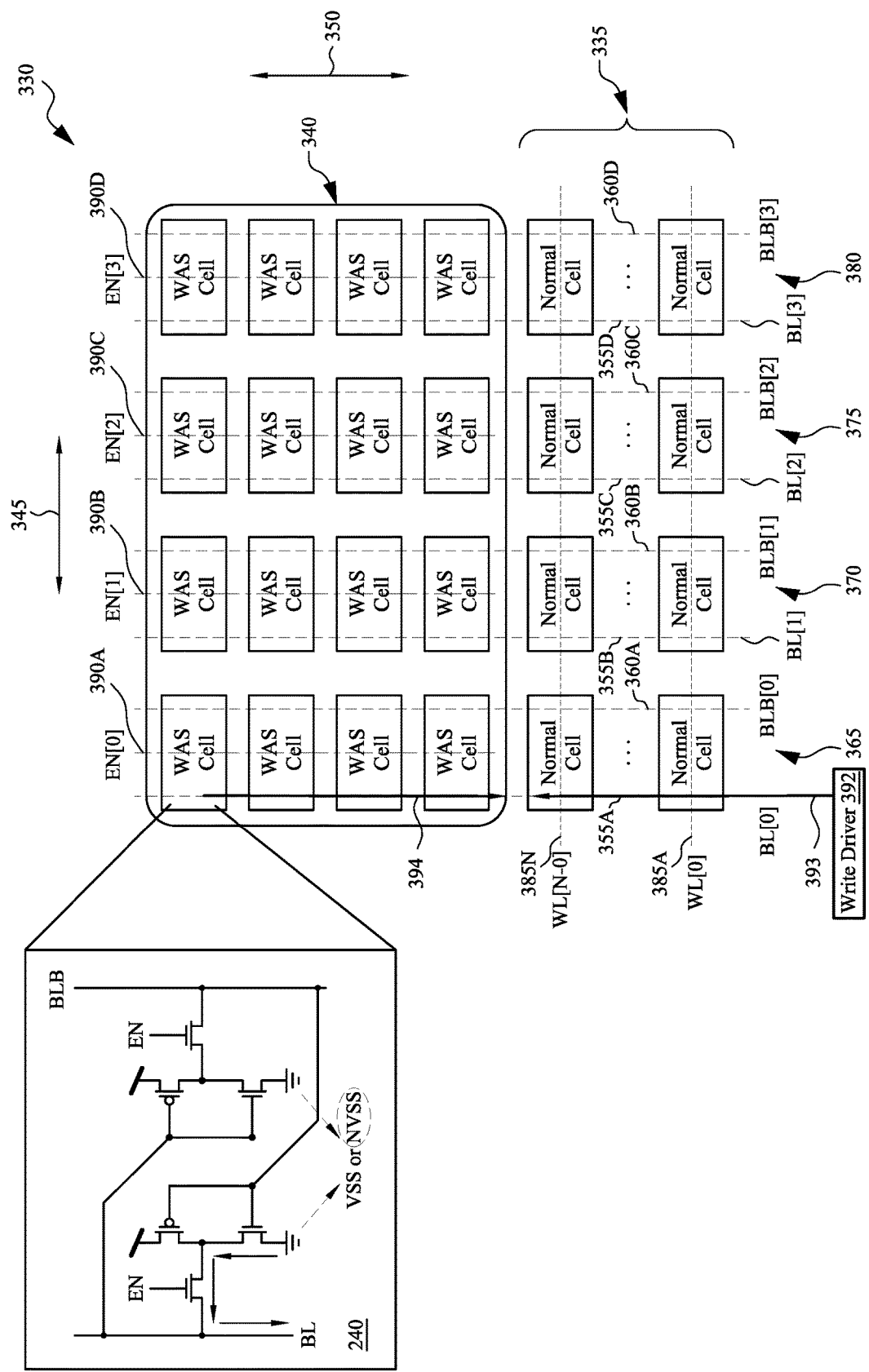
FIG. 4 is an example block diagram showing additional details of the SRAM array of FIG. 1, in accordance with some embodiments.

In conventional memory devices, if a WAS circuit is provided, the WAS circuit is integrated within the input/output circuits of the memory device. Integrating the WAS circuit within the input/output circuits is not as effective, requires extra area, and increases the overall size of an SRAM memory. Further, when integrated in the input/output circuits, the WAS circuit requires extra circuitry to integrate with the SRAM array, and particularly, with the SRAM cells of the SRAM array, thereby also increasing the cost of the overall SRAM array. Thus, integrating a WAS circuit in the input/output circuits may be undesirable. In contrast, the WAS cell 240 of the present disclosure may be embedded directly within the SRAM array 105 along with the SRAM cells, as shown in FIG. 4 below. By embedding the WAS cell 240 directly within the SRAM array 105, no extra circuitry to integrate the WAS cell with the SRAM array or the SRAM cells is needed, thereby eliminating or significantly reducing the periphery transition cost of the SRAM array. Further, by being able to embed the WAS cell 240 directly within the SRAM array 105, the WAS cell may be integrated at the location where the voltage boost is desired. For example, in some embodiments, the WAS cell 240 may be integrated closer to the bit lines 205 and 215 that are farther away from the input/output circuits since those farther away bit lines may need a greater boost in voltage than the bit lines that are closer to the input/output circuits.

Referring to FIG. 4, an example SRAM array 330 is shown, in accordance with some embodiments of the present disclosure. The SRAM array 330 is analogous to the SRAM array 105. The SRAM array 330 includes an SRAM portion 335 having a plurality of SRAM cells and a WAS portion 340 having a plurality of WAS cells. The SRAM cells in the SRAM portion 335 and the WAS cells in the WAS portion 340 are arranged in a plurality of rows extending in a row direction 345 (e.g., in the X-direction 110) and a plurality of columns extending in a column direction 350 (e.g., in the Y-direction 115). Each of the plurality of SRAM cells in the SRAM portion 335 may be configured similar to the SRAM cell 145 and each of the plurality of WAS cells in the WAS portion 340 may be configured similar to the WAS cell 240 or the configuration of the WAS cells described in FIGS. 6-8 below.

The number of rows and the number of columns in the SRAM portion 335 may vary depending upon the memory capacity of the SRAM array 330 that is desired. Thus, although at least two rows and four columns are shown in the SRAM portion 335, in other embodiments, the SRAM portion may include greater or fewer than two rows and greater or fewer than four columns. Further, in some embodiments, the number of rows in the WAS portion 340 may vary based upon the voltage boosting capacity of each WAS cell and the total voltage boosting capacity that is desired for each column of the SRAM portion 335. Although four rows are shown in the WAS portion 340, in other embodiments, the WAS portion may include greater than or fewer than four rows. Further, in some embodiments, the number of columns in the WAS portion 340 may be equal to the number of columns in the SRAM portion 335. In other words, in some embodiments, one column of WAS cells may be provided in the WAS portion 340 for each column of the SRAM cells in the SRAM portion 335. Although FIG. 4 shows that each column has four WAS cells, in other embodiments, one or more columns of the WAS portion 340 may have different number of WAS cells compared to another column.

Each SRAM cell in the SRAM portion 335 may be connected to differential bit lines and a word line. For example, the SRAM array 330 may include bit lines 355A-355D and 360A-360D, with the bit lines 355A and 360A being connected to all SRAM cells located in column 365, the bit lines 355B and 360B being connected to all SRAM cells located in column 370, the bit lines 355C and 360C being connected to all SRAM cells located in column 375, and the bit lines 355D and 360D being connected to all SRAM cells located in column 380. The bit lines 355A-355D and 360A-360D extend in the column direction 350.

Each of the bit lines 355A-355D is similar to the bit line 205 and 300, and each of the bit lines 360A-360D is similar to the bit lines 215 and 290. Thus, the bit lines 355A-355D and 360A-360D extend to the WAS portion 340 as well and are shared by the SRAM cells and the WAS cells that are located in the respective ones of the columns 365-380.

The SRAM portion 335 may also include a plurality of word lines 385A-385N. Each of the plurality of word lines 385A-385N extends in the row direction 345 and is shared by all SRAM cells that are located in the same row. Each of the plurality of word lines 385A-385N is similar to the word line 235. The WAS portion 340 may include, in addition to the bit lines 355A-355D and 360A-360D, a plurality of enable signal lines 390A-390D. Each of the plurality of enable signal lines 390A-390D is analogous to the enable signal 325. In some embodiments, each of the plurality of enable signal lines 390A-390D extends in the column direction 350. Thus, all WAS cells in a particular column may be connected to the same enable signal such that by asserting the enable signal of a particular column, all WAS cells of that column may be enabled. By enabling the WAS cells of a particular column, the bit line voltages of the bit line 355A-355D of that particular column may be maintained/boosted during read and write operations.

Although FIG. 4 shows that the plurality of enable signal lines 390A-390D extend in the column direction 350, in some embodiments, the plurality of enable signal lines 390A-390D may extend in the row direction 345. Thus, for example, in some embodiments, instead of running parallel to the bit lines 355A-355D and 360A-360D, in some embodiments, the plurality of enable signal lines 390A-390D may run parallel to the plurality of word lines 385A-385N. When running in the row direction 345, a single enable signal line may be provided for each write row (e.g., for writing to SRAM cells in a particular row). Although the plurality of enable signal lines 390A-390D is different from the plurality of word lines 385A-385N, in some embodiments, the word lines may be used as the enable signal lines.

However, by virtue of keeping the plurality of enable signal lines 390A-390D separate from the plurality of word lines 385A-385N, the SRAM cells in the SRAM portion 335 may be enabled without needing to enable the WAS cells in the WAS portion 340. Further, by keeping the plurality of enable signal lines 390A-390D separate from the plurality of word lines 385A-385N, active power due to dummy read operations may be saved. In some embodiments, a dummy read operation may occur when the word line (e.g., the word line 235) of a particular SRAM cell (e.g., the SRAM cell 145) is enabled, thereby enabling the first access transistor (e.g., the first access transistor 210) and the second access transistor (e.g., the second access transistor 220), but the bit lines (e.g., the bit lines 205 and 215) are not selected for a read operation. The bit lines (e.g., the bit lines 205 and 215), which may have been initially pre-charged (e.g., before the enabling of the word line 235) may become discharged after the word line is enabled. Since the bit lines (e.g., the bit lines 205 and 215) are not selected for a read operation, the enabling of the word line (e.g., the word line 235) without selecting the bit lines (e.g., the bit lines 205 and 215) results in a dummy read operation. A dummy read operation may unnecessarily consume power. By keeping the plurality of enable signal lines 390A-390D separate from the plurality of word lines 385A-385N, if a word line is enabled, the WAS cells are not impacted, thereby saving power during dummy read operations, which may be consumed if the WAS cells were also enabled due to sharing of word lines. Also, by keeping the plurality of enable signal lines 390A-390D separate from the plurality of word lines 385A-385N, the WAS cells may be considered immune to dummy operations.

Further, in some embodiments, the supply voltage (e.g., the supply voltage 180 and 265) of the SRAM cells and WAS cells may be separate pins. For example, in some embodiments, the supply voltage 180 of the SRAM cells in the SRAM portion 335 may be connected to VDD and the supply voltage 265 of the WAS cells in the WAS portion 340 may be connected to cell-VDD (CVDD) to provide a separate bit line power down feature. In some embodiments, the ground voltage (e.g., the ground voltage 185, 270) of the SRAM and WAS cells may be separate pins as well. For example, in some embodiments, the ground voltage 185 of the SRAM cells in the SRAM portion 335 may be connected to VSS and the ground voltage 270 of the WAS cells in the WAS portion 340 may be connected to Negative VSS (NVSS) to support a negative bit line feature.

During write operations, a particular one of the plurality of word lines 285A-285N may be asserted to write data to the SRAM cells associated with the asserted word line. To increase write reliability, in some embodiments, a negative bit line (NBL) circuit may be associated with the write driver to generate a negative VSS (NVSS) voltage. The NBL circuit may apply the NVSS voltage to the bit lines (e.g., the bit lines 355A-355D, 360A-360D) of the SRAM cells whose word line has been asserted via the write driver. Thus, the write driver of the input/output circuits may be configured to feed NVSS to the bit lines 355A-355D and 360A-360D where a logic low level (e.g., 0 or 0V) is to be applied to those bit lines. NVSS increases the voltage level of the first access transistors 210 and 310, as well as the voltage level of the second access transistors 220 and 320, thereby increasing the drive current within the SRAM cells and WAS cells to enhance writing a logic low level (e.g., 0) data to the SRAM cells.

In some embodiments, the ground voltage pin (e.g., VSS pin) connected to the ground voltage 270 of each WAS cell in the WAS portion 340 may be connected to an NVSS signal through one or more metal layers, such that the NVSS signal may go into the bit lines 355A-355D and 360A-360D to induce the NVSS from both sides of the bit line (e.g., from write driver 392 of the input/output circuits (outside of and operatively coupled with the SRAM array 330), as shown by arrow 393, and from the WAS cell, as shown by arrow 394). Thus, the WAS cells in the WAS portion 340 are compatible with an NBL mechanism.

Additionally, by sharing the bit lines 355A-355D and 360A-360D between the SRAM cells in the SRAM portion 335 and the WAS cells in the WAS portion 340, the WAS cells may be considered content aware. In other words, the WAS cells may be configured to automatically sense the voltage levels of the bit lines 355A-355D and 360A-360D for boosting, thereby improving write margins automatically during a write operation.

Figures 5D, 5E:
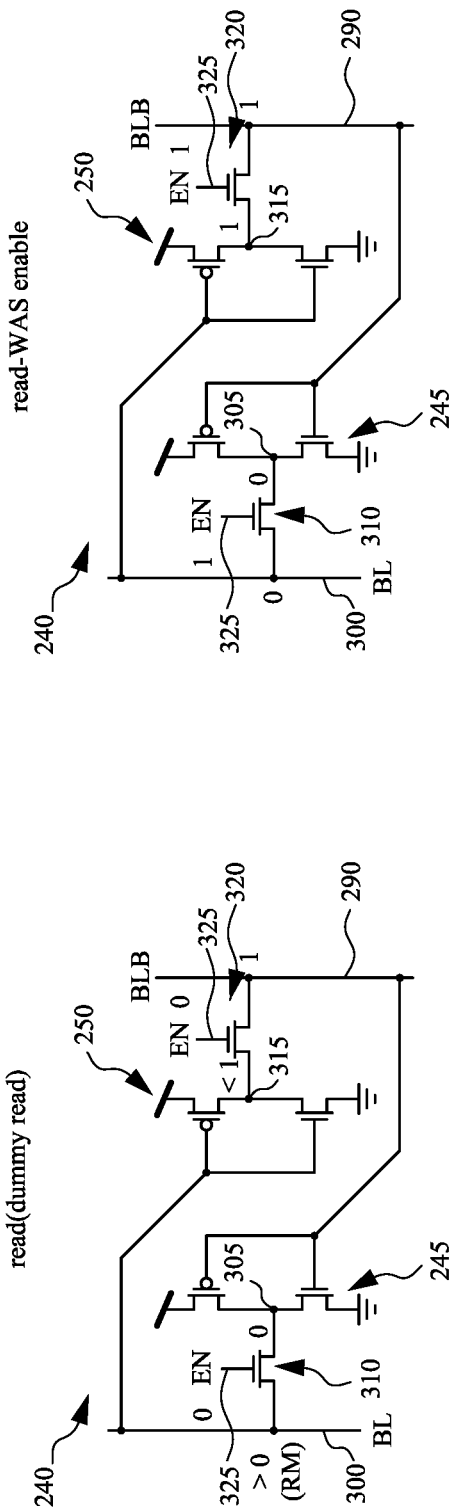

Turning to FIGS. 5A-5E, example operations of the WAS cell 240 are shown, in accordance with some embodiments of the present disclosure. FIG. 5A shows the WAS cell 240 during a pre-charge operation, FIG. 5B shows a write operation when the WAS cell 240 is not enabled and FIG. 5C shows a write operation when the WAS cell is enabled. FIG. 5D shows a dummy read operation and FIG. 5E shows a read operation with the WAS cell 240 enabled.

The bit lines 355A-355D and 360A-360D of the SRAM cells in the SRAM portion 335 may be pre-charged to high (e.g., VDD, CVDD) before a read or write operation. In some embodiments, the bit lines 355A-355D and 360A-

360D may be connected to a pre-charge circuit that pre-charges those bit lines by applying a high voltage (e.g., VDD) or logic high level (e.g., 1). Since the bit lines 355A-355D and 360A-360D are shared with the bit lines of the WAS cells in the WAS portion 340, the same voltage level is applied to the bit lines 290 and 300. During the pre-charge operation, the WAS cells are not enabled. For example and as shown in FIG. 5A, the enable signal 325 is at a logic low level (e.g., 0 or 0V). When the enable signal 325 is at the logic low level, the first access transistor 310 and the second access transistor 320 are turned OFF, thereby disconnecting the bit line 300 and 290, respectively from the output nodes 305 and 315. However, since the bit lines 290 and 300 are held at a logic high level, the output nodes 305 and 315 are at logic low level (e.g., 0). Specifically, since the bit line 300 is connected to the input of the inverter 250 and the bit line 300 is at a logic high level during the pre-charge operation, the inverter 250 inverts the logic high level input to a logic low level output at the output node 315. Similarly, since the bit line 290 is connected to the input of the inverter 245 and the bit line 290 is held at a logic high level during the pre-charge operation, the inverter inverts the logic high level to a logic low level output at the output node 305.

FIG. 5B shows a write operation when the WAS cell 240 is not enabled. To write data (e.g., bit 0) to the SRAM cell 145, the bit lines 355A-355D may be held at a logic low level (e.g., 0 or 0V) and the bit lines 360A-360D may be held at a logic high level (e.g., 1). As indicated above, the IR drop in the bit lines 355A-355D, particularly in those bit lines that are farther away from the input/output circuits, may be significant increasing the voltage level of those bit lines to greater than a logic low level. When the bit lines 355A-355D are greater than a logic low level, the writing of data in the SRAM cells may become unreliable. When the WAS cells are disabled (e.g., by keeping the first access transistor 310 and the second access transistor 320 turned OFF), the voltage levels of the bit lines 355A-355D continue to be greater than a logic low level, as shown in FIG. 5B.

However, when the WAS cell 240 is enabled, as shown in FIG. 5C, the WAS cell helps the bit lines 355A-355D to be maintained at or much closer to the logic low level, thereby ensuring write reliability. The WAS cell 240 may be enabled by applying a logic high level to the enable signal 325 of the first access transistor 310 and the second access transistor 320. When the first access transistor 310 is turned ON, the bit line 300 is connected to the output node 305. Similarly, when the second access transistor 320 is turned ON, the bit line 290 is connected to the output node 315. When the first access transistor 310 is enabled, the bit line 300 is pulled or discharged to a logic low level due to the second transistor 260 being connected to the ground voltage 270. Thus, the bit line 300 is maintained at or very close to the logic low level. When the WAS cell is integrated into the SRAM array 105, 330, and since the bit line of the WAS cell is shared with the bit line of the SRAM cells, the bit lines of the SRAM cells are also maintained at or very close to the logic low level.

For example, in the SRAM array 330, if a bit of data is being written to one of the SRAM cells of the SRAM portion 335 in the column 365, the bit line 355A may be applied a logic low level. However, due to the IR drop, the bit line may actually be at a logic level that is greater than logic low level. Since the bit line 355A is connected to the WAS cells in the WAS portion 340, one or more of the WAS cells in the column 365 may be enabled (e.g., by applying a logic high level to the enable signal line 290A), which pulls the bit line 355 to or very close to a logic low level, thereby ensuring write integrity in the SRAM cells of the SRAM portion in the column 365.

The WAS cell 240 is also immune to a dummy read operation. As indicated above, during a dummy read operation, the word line of an SRAM cell may be enabled without selecting the bit line. As shown in FIG. 5D, the WAS cell remains disabled and substantially maintains its pre-charge operation state. During a read operation, as shown in FIG. 5E, the WAS cell 240 is enabled and allows the bit line 300 to be maintained at or very close to a logic low level (e.g., 0) similar to the write operation, as shown in FIG. 5C.

Figure 6:
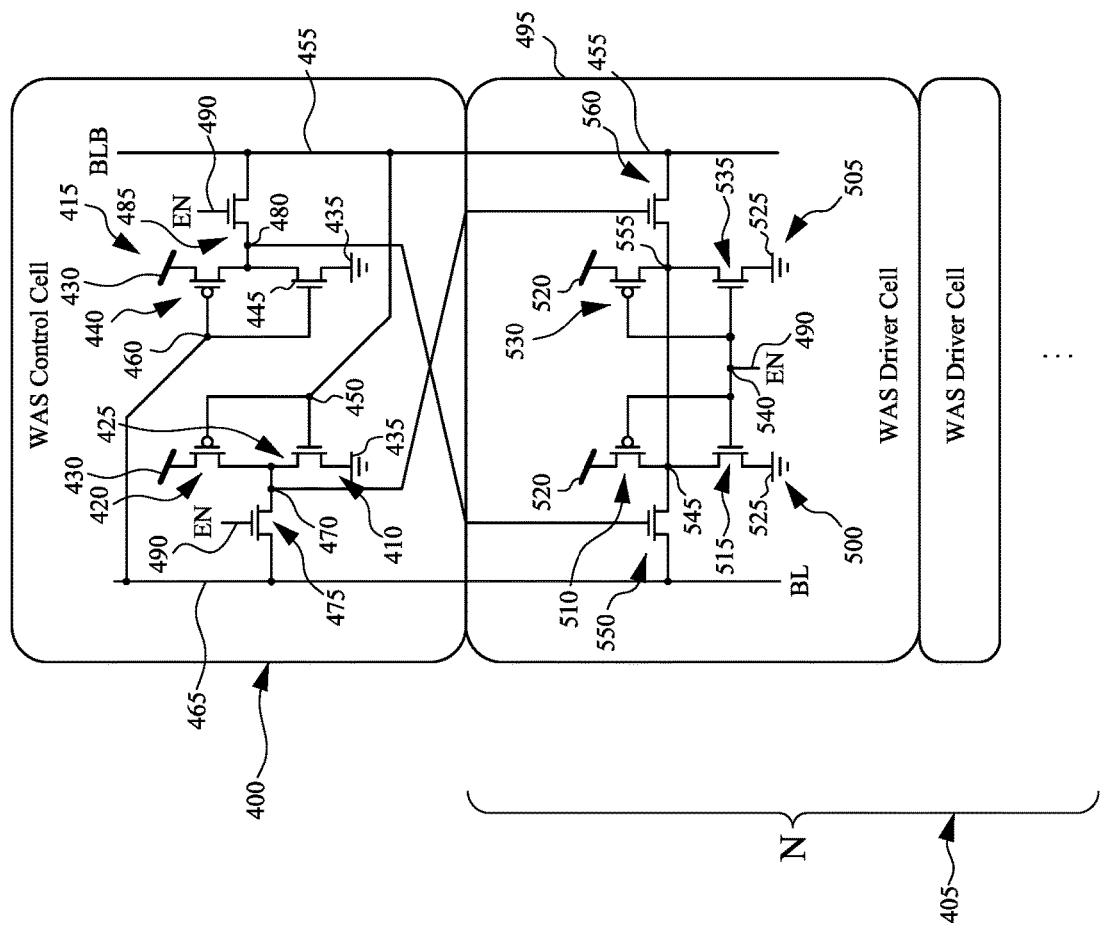
FIG. 6 is an example circuit diagram of another WAS cell of the SRAM array of FIG. 1, in accordance with some embodiments.

Referring to FIG. 6, an alternate example of a WAS cell 395 is shown, in accordance with some embodiments of the present disclosure. The WAS cell 395 may include a WAS control cell 400 and one or more WAS driver cells 405. The one or more WAS driver cells 405 may be connected to the WAS control cell 400 to increase the driving current of the WAS control cell. The WAS control cell 395 is similar to the WAS cell 240. Thus, the WAS control cell 395 may include six transistors (e.g., metal-oxide-semiconductor (MOS) transistors) forming two inverters 410 and 415. The inverter 410 may include a first transistor 420 and a second transistor 425 connected between a supply voltage 430 (e.g., VDD, CVDD) and a ground voltage 435 (e.g., VSS, NVSS). The inverter 415 may similarly include a first transistor 440 and a second transistor 445 connected between the supply voltage 430 and the ground voltage 435.

An input node 450 of the inverter 410 may be coupled to a bit line 455 and an input node 460 of the inverter 415 may be coupled to a bit line 465. The bit lines 455 is analogous to the bit lines 360A-360D and the bit line 465 is analogous to the bit lines 355A-355D. Further, an output node 470 of the inverter 410 may be coupled to the bit line 465 through a first access transistor 475 and an output node 480 may be coupled to the bit line 455 through a second access transistor 485. The first access transistor 475 and the second access transistor 485 may also be connected to an enable signal 490. The enable signal 490 may be used to turn ON or turn OFF the first access transistor 475 and the second access transistor 485. In some embodiments, each of the first access transistor 475 and the second access transistor 485 may be an n-type transistor. In other embodiments, either or both of the first access transistor 475 and the second access transistor 485 may be a p-type transistor. Similarly, in some embodiments, the first transistors 420 and/or 440 may be n-type (even though p-type is shown in FIG. 6) and the second transistors 425 and/or 445 may be p-type (even though n-type is shown in FIG. 6).

The WAS control cell 400 may be connected to each of the one or more WAS driver cells 405. A WAS driver cell 495 of the one or more WAS driver cells 405 may include six transistors (e.g., metal-oxide-semiconductor (MOS) transistors) forming two inverters 500 and 505. The inverter 500 may include a first transistor 510 and a second transistor 515 connected between a supply voltage 520 (e.g., VDD, CVDD) and a ground voltage 525 (e.g., VSS or NVSS). The inverter 505 may similarly include a first transistor 530 and a second transistor 535 connected between the supply voltage 520 and the ground voltage 525. In some embodiments, the first transistor 510 and 530 may each be a p-type transistor. In other embodiments, either or both of the first transistor 510 and 530 may be n-type transistors. Similarly, in some embodiments, each of the second transistor 515 and 535 may be n-type transistors. In other embodiments, either or both of the second transistors 515 and 535 may be p-type transistors.

An input node 540 of the inverters 500 and 505 may be connected to the enable signal 490 of the WAS control cell 400. An output node 545 of the inverter 500 may be connected to the bit line 465 through a first access transistor 550 and an output node 555 of the inverter 505 may be connected to the bit line 455 through a second access transistor 560. The first access transistor 550 and the second access transistor 560 may be controlled (e.g., turned ON and turned OFF) based upon the voltage level at the output nodes 480 and 470, respectively. In some embodiments, each of the first access transistor 550 and the second access transistor 560 may be n-type transistors. In other embodiments, either or both of the first access transistor 550 and the second access transistor 560 may be p-type.

Thus, the WAS control cell 400 may be connected to the WAS driver cell 495 through the enable signal 490 being connected to the input node 540 of each of the inverters 500 and 505, the output node 470 being connected to the second access transistor 560, and the output node 480 being connected to the first access transistor 550. Each WAS driver cell in the one or more WAS driver cells 405 may be similarly connected to the WAS control cell 400. Although a single WAS control cell (e.g., the WAS control cell 400) is shown connected to the one or more WAS driver cells 405, in other embodiments, multiple WAS control cells connected to multiple WAS driver cells may be used in a similar configuration as the WAS cells in the WAS portion 340. The number of WAS driver cells in the one or more WAS driver cells 405 may vary depending upon the current increasing capacity of each WAS driver cell (e.g., the size of the first and the second transistors) and the desired level of driving current in the WAS control cell 400. In some embodiments, the WAS control cell 400 and each of the one or more WAS driver cells 405 may have a similar area footprint as an SRAM cell. For example, in some embodiments, an SRAM cell may have an area footprint of 2 contacted polysilicon pitch (e.g., 2CPP). Since the WAS control cell 400 is configured similar to an SRAM cell, the WAS control cell also has the same or similar area footprint of 2CPP. Similarly, the WAS cell 240 may have an area footprint of 2CPP. Each of the one or more WAS driver cells 405 may also have an area footprint of 2CPP. Thus, the total area footprint of the WAS cell 395 may be 2CPP for the WAS control cell 400 plus (2CPP*N) for the total area footprint of the one or more WAS driver cells 405.

Figure 7:
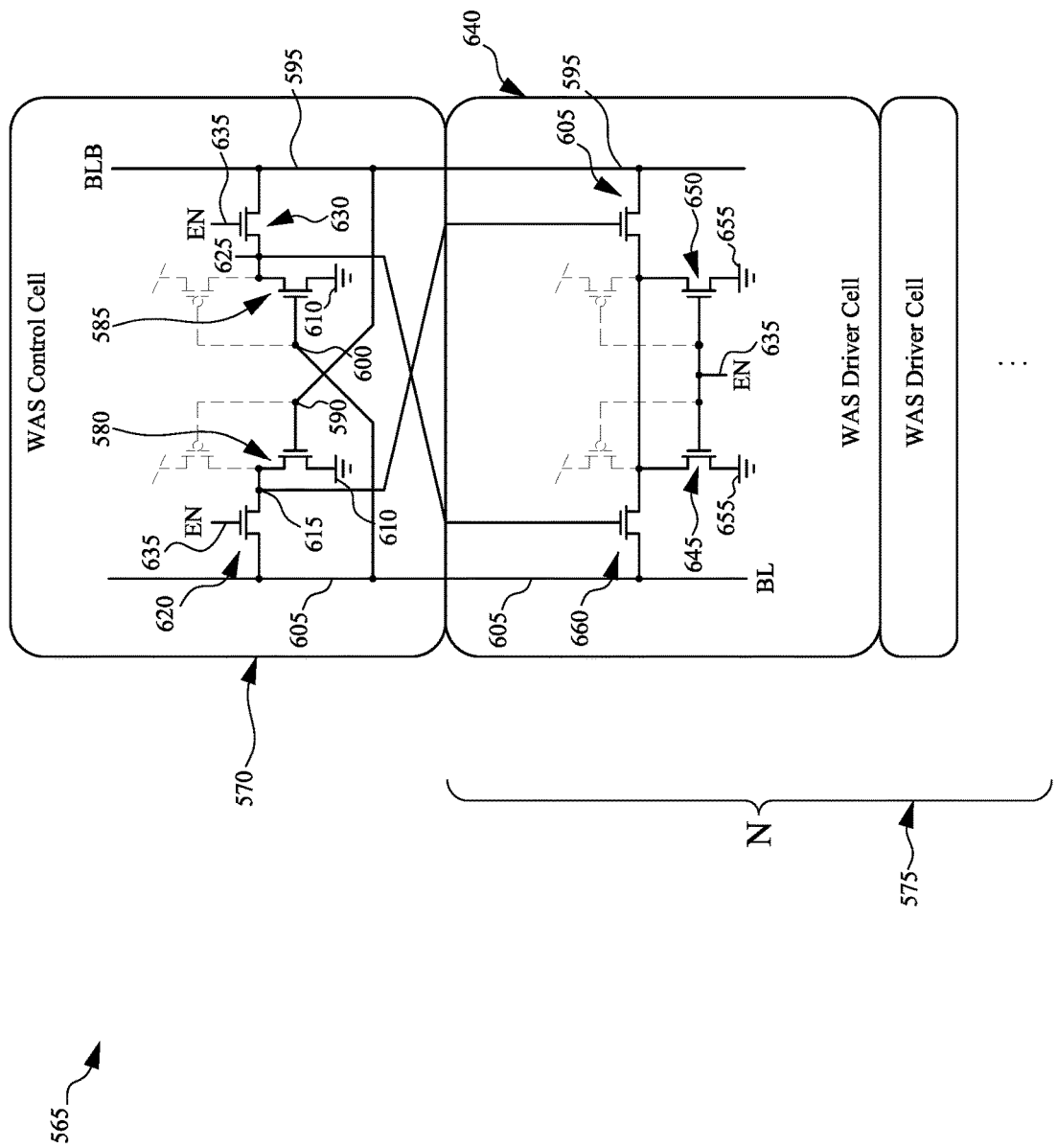
FIG. 7 is an example circuit diagram of yet another WAS cell of the SRAM array of FIG. 1, in accordance with some embodiments.

Turning to FIG. 7, another example WAS cell 565 is shown, in accordance with some embodiments of the present disclosure. The WAS cell 565 may include a WAS control cell 570 and one or more WAS driver cells 575 similar to the WAS cell 395. The WAS control cell 570 is similar to the WAS control cell 400 with the exception of the first transistors 420 and 440. In the WAS control cell 570, the first transistors 420 and 440 may be disabled or removed to eliminate direct current in the WAS control cell 570. In some embodiments, the first transistors 420 and 440 may be disabled by removing or disabling the supply voltage 430. Thus, the WAS control cell 570 may include a first transistor 580 and a second transistor 585. An input node 590 of the first transistor 580 may be connected to a bit line 595 and an input node 600 of the second transistor 585 may be connected to bit line 605. A first terminal of the first transistor 580 may be connected to ground voltage 610 (e.g., VSS or NVSS) and a second terminal of the first transistor may be connected to an output node 615, which may be connected to the bit line 605 through a first access transistor 620. Similarly, a first terminal of the second transistor 585 may be connected to the ground voltage 610 (e.g., VSS or NVSS) and a second terminal of the second transistor may be connected to an output node 625, which may be connected to the bit line 595 through a second access transistor 630. An enable signal 635 may be used to control the first access transistor 620 and the second access transistor 630.

A WAS driver cell 640 of the one or more WAS driver cells 575 may be similarly configured as the WAS driver cell 495 with the exception that the WAS driver cell 640 has the first transistors 510 and 530 disabled or removed by disabling or removing the supply voltage 520. Thus, the WAS driver cell 640 includes a first transistor 645 and a second transistor 650, a first terminal of each of which may be connected to ground voltage 655 (e.g., VSS or NVSS). The input of each of the first transistor 645 and the second transistor 650 may be connected to the enable signal 635. A second terminal of each of the first transistor 645 and the second transistor 650 may be connected to the bit line 605 and 595, respectively, through a respective one of a first access transistor 660 and a second access transistor 665. The first access transistor 660 may be controlled by the voltage level at the output node 625 and the second access transistor 665 may be controlled by the voltage level at the output node 615.

Figure 8:
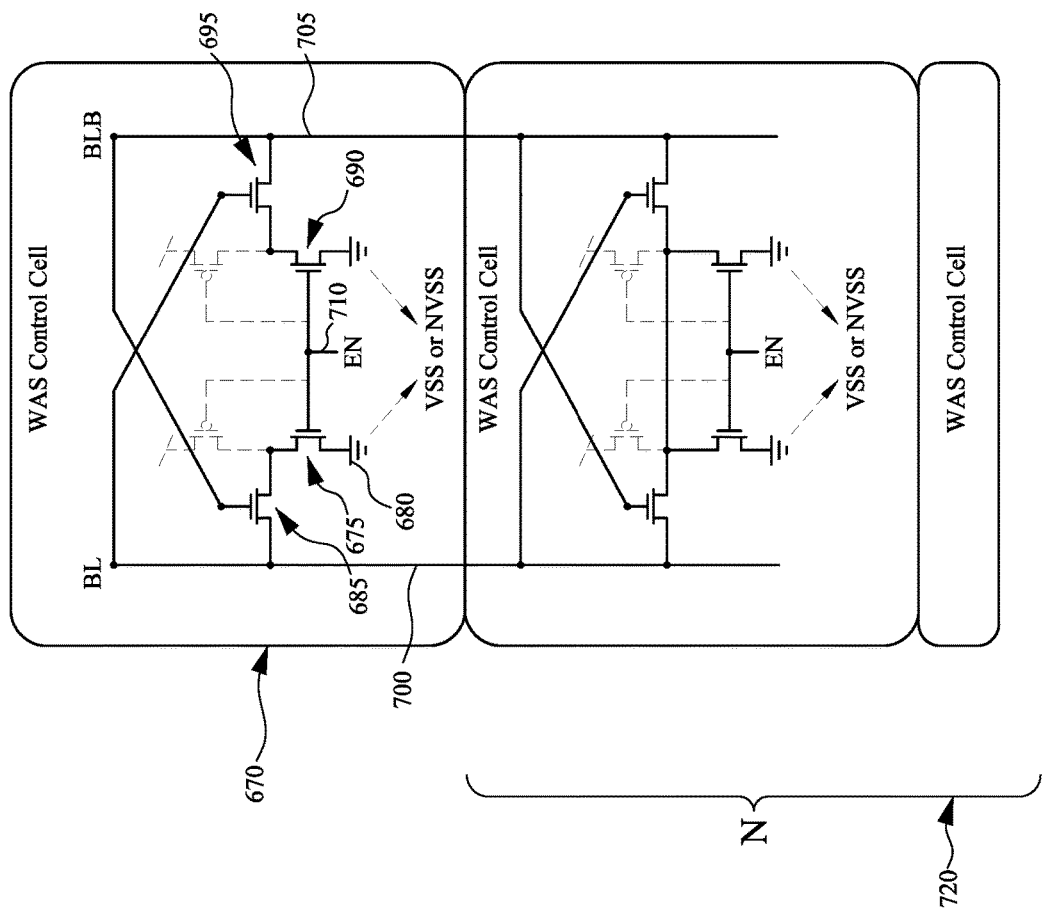
FIG. 8 is an example circuit diagram of yet another WAS cell of the SRAM array of FIG. 1, in accordance with some embodiments.

Referring to FIG. 8, another example of a WAS cell 670 is shown, in accordance with some embodiments of the present disclosure. The WAS cell 670 may be considered more process friendly and removes or disables the p-type transistors (e.g., the first transistors 255 and 275) by removing or disabling the supply voltage (e.g., the supply voltage 265). The WAS cell 670 may include a first transistor 675 connected between a ground voltage 680 (e.g., VSS or NVSS) and a first access transistor 685. The WAS cell 670 also includes a second transistor 690 between the ground voltage 680 and a second access transistor 695. The first access transistor 685 may be connected to a bit line 700 and the second access transistor 695 may be connected to a bit line 705. Further, the first access transistor 685 may be turned ON and OFF based upon a voltage level of the bit line 705 and the second access transistor 695 may be turned ON and OFF based upon a voltage level of the bit line 700. An enable signal 710 may be applied to at the input of the first transistor 675 and the second transistor 690 to control operation of those transistors.

Although the WAS cell 670 is not shown associated with a WAS driver cell, in other embodiments, the WAS cell 670 may be associated with one or more WAS driver cells similar to the WAS driver cells 495 or 640. Further, the WAS cell 670 may be connected with other WAS cells 720 in a similar configuration as the WAS cells in the WAS portion 340, and each of the WAS cells may be associated with one or more WAS driver cells (e.g., the WAS driver cells 495 or 640).

Figure 9:
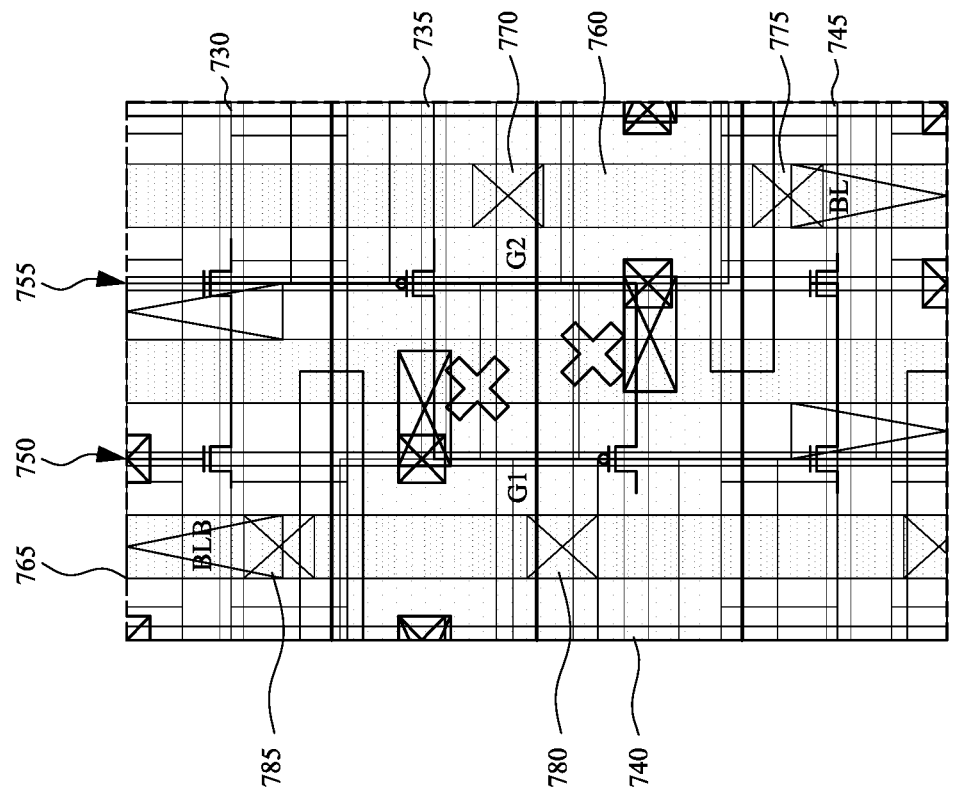
FIG. 9 is an example standard cell layout design of the WAS cell of FIG. 3, in accordance with some embodiments.

Referring to FIG. 9 now, an example layout design 725 of the WAS cell 240 is shown, in accordance with some embodiments of the present disclosure. The layout design 725 may be used to fabricate at least a portion of a semiconductor device implementing the functionality described in FIG. 3 above. The layout design 725 may define features of active devices (e.g., the first transistors 255, 275, the second transistors 260, 280, the first access transistor 310, the second access transistor 320) of the WAS cell 240 along an active region. An "active region" may be a fin-shaped region of one or more three-dimensional field-effect-transistors (e.g., FinFETs, gate-all-around (GAA) transistors including nanosheet transistors and nanowire transistors), or an oxide-definition (OD) region of one or more planar metal-oxide-semiconductor field-effect-transistors (MOSFETs). The active region may define source or drain terminals of the active devices. Gate terminals of those transistors may be defined by gate structures, which may be formed of one or more conductive materials (e.g., polysilicon(s), metal (s)), and may overlay respective portions of the active region to define the active devices.

For example, the layout design 725 shows active regions 730, 735, 740, and 745, which define the source and drain regions of the first transistors 255, 275, the second transistors 260, 280, the first access transistor 310, the second access transistor 320. In some embodiments, the active regions 730-745 may extend in an X-direction (e.g., the X-direction 110). The layout design 725 also shows gate structures 750 and 755 overlaying the active regions 730-745 and defining the gate terminals of the first transistors 255, 275, the second transistors 260, 280, the first access transistor 310, the second access transistor 320. In some embodiments, the gate structures 750 and 755 extend in a Y-direction (e.g., the Y-direction 115). Portions of the active regions 730-745 that are disposed on the left-hand side and right-hand side of a respective one of the gate structures 750 and 755 may define the source and drain terminals of the first transistors 255, 275, the second transistors 260, 280, the first access transistor 310, the second access transistor 320.

Specifically, and referring to FIG. 9 in conjunction with FIG. 3, the gate structure 750 overlaying the active region 730 may define the gate terminal of the second access transistor 320, while the portion of that active region on the left hand side and the right hand side of that gate structure may define the source and drain terminals of that second access transistor. Similarly, the gate structure 755 overlaying the active region 730 may define the gate terminal of the second transistor 280, with the portion of the active region on the left-hand side and the right-hand side of that gate structure defining the source and drain terminals of that second transistor. The gate structure 755 overlaying the active region 735 may define the gate terminal of the first transistor 275, with the portion of the active region on the left-hand side and the right-hand side of that gate structure defining the source and drain terminals of the first transistor. The gate structure 750 overlaying the active region 740 may define the gate terminal of the first transistor 255, with the portion of the active region on the left-hand side and the right-hand side of that gate structure defining the source and drain terminals of the first transistor. The gate structure 750 overlaying the active region 745 may define the gate terminal of the second transistor 260, with the portion of the active region on the left-hand side and the right-hand side of that gate structure defining the source and drain terminals of that second transistor. The gate structure 755 overlaying the active region 745 may define the gate terminal of the first access transistor 310, with the portion of the active region on the left-hand side and the right-hand side of that gate structure defining the source and drain terminals of the first access transistor.

Thus, the gate terminal of each of the first transistors 255, 275, the second transistors 260, 280, the first access transistor 310, the second access transistor 320 is defined by one of the gate structures 750 or 755, and the source and drain terminals of those transistors are defined by the respective one of the active region 730-745 that underlies either side of the gate structure. Additionally, the gate terminals of the first access transistor 310 and the second access transistor 320 may be connected to the enable signal 325 (not shown in FIG. 9). This connection may be facilitated by electrically connecting the gate structures of the first access transistor 310 and the second access transistor 320 with an interconnect layer representing the enable signal 325. In some embodiments, the interconnect layer used to electrically connect the first access transistor 310 and the second access transistor 320 to the enable signal 325 may each include a conductive material, such as one or more metal materials, and may be formed using a Metal 0 (M0) or Metal 1 (M1) layer. In some embodiments, the M1 layer may be formed above the M0 layer. In some embodiments, the M0 layer may be immediately above the gate structures 750 and 755, and the M0 layer may be sandwiched between the M1 layer and those gate structures. In other embodiments, the interconnect layer representing the enable signal 325 may be formed at other interconnect levels. Further, in some embodiments, the M1 layer may extend perpendicular (or substantially perpendicular) to the M0 layer. For example, in some embodiments, the M0 layer may extend in the X-direction 110, while the M1 layer may extend in the Y-direction 115. In other embodiments, the M0 and M1 layers may extend in the same (or substantially similar) direction.

In some embodiments, to connect the second access transistor 320 to the enable signal 325, the gate structure 750 may be electrically connected to the interconnect layer representing the enable signal using an interconnect structure (not shown in FIG. 9). In some embodiments, the interconnect structure may include one or more via structures that provides an electrical connection between the gate structure and the interconnect layer. Similarly, to connect the gate terminal of the first access transistor 310 to the enable signal 325, the gate structure 755 defining the gate terminal of the second access transistor may be connected to the interconnect layer representing the enable signal using an interconnect structure (e.g., one or more vias).

Further, the first access transistor 310 and the second access transistor 320 may be connected to the bit lines 300 and 290, respectively. The bit line 300 may also be connected to the input node 295 and the bit line 290 may also be connected to the input node 285. This connection is shown in the layout design 725 by virtue of interconnect layers 760 and 765. Specifically, in some embodiments, the active region 735 defining the source and drain terminals of the first transistor 275 may be connected to the interconnect layer 760 through an interconnect structure 770, while the active region 745 defining the source and drain terminals of the first access transistor 310 may be connected to the interconnect layer 760 through an interconnect structure 775. Similarly, in some embodiments, the active region 740 defining the source and drain terminals of the first transistor 255 may be connected to the interconnect layer 765 through an interconnect structure 780, while the active region 730 defining the source and drain terminals of the second access transistor 320 may be connected to the interconnect layer 765 through an interconnect structure 785. In some embodiments, the interconnect layers 760 and 765 may each be metal diffusion (MD) layers. In other embodiments, either or both of the interconnect layers 760 and 765 may be other types of interconnect layers.

To remove or disable the first transistors 255 and 275 to achieve the configuration of the WAS control cell 570, the layout design 725 may be slightly modified to remove or disable the electrical connection between the interconnect layer representing the supply voltage 265 and the active regions 735 (forming the first transistor 275) and 740 (forming the first transistor 255).

Figure 10:
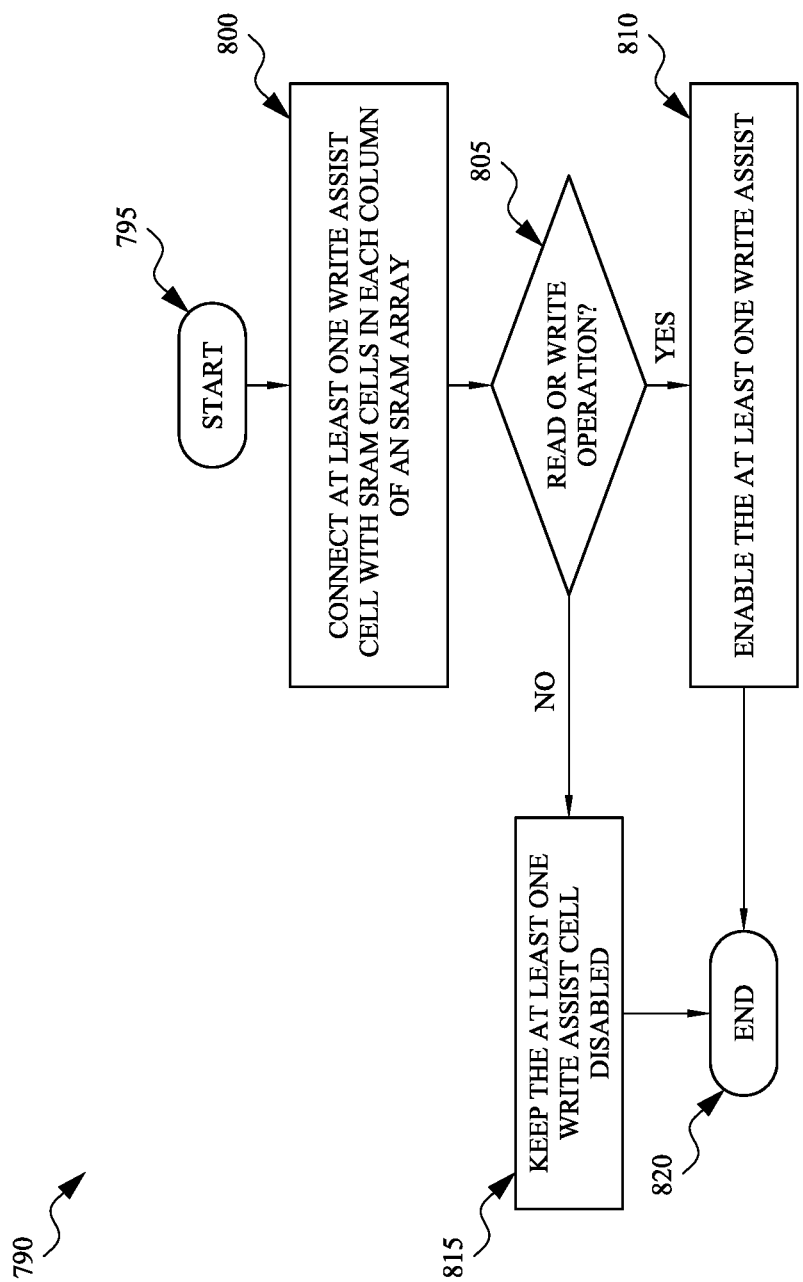
FIG. 10 is an example flowchart outlining operations of the WAS cell of FIGS. 3 and 6-8, in accordance with some embodiments.

Referring to FIG. 10, an example flowchart outlining a process 790 for operating the WAS cell 240 is shown, in accordance with some embodiments of the present disclosure. The process 790 may also be used for operating the WAS cells of FIGS. 6-8. As indicated above, the WAS cell 240 may be used to counteract the effects of IR drop and maintain the voltage level of the bit line 300 at or very close to a low voltage level during a read or write operation. Thus, upon starting at operation 795, the WAS cell 240 is connected to an SRAM cell within the SRAM array (e.g., the SRAM array 330) at operation 800. Specifically, in some embodiments, at least one WAS cell may be used in each column of the SRAM array to control the bit line voltage on the bit line of that column. Thus, the WAS cells are provided within the SRAM array and not in the input/output circuits. At operation 805, a controller controlling the WAS cells determines whether a read or write operation is being performed. If the controller determines that a read or write operation is being performed on the SRAM cells to which the WAS cells are connected, the associated WAS cells are enabled (e.g., by asserting the enable signal 325), as shown in FIGS. 5C and 5E, at operation 810. If the controller determines that no read or write operations are being performed (e.g., pre-charge or dummy read operations are being performed), then the controller keeps the WAS cells disabled (e.g., by not asserting the enable signal 325), as shown in FIGS. 5A and 5D, at operation 815. The process 790 ends at operation 820.

Figure 11:
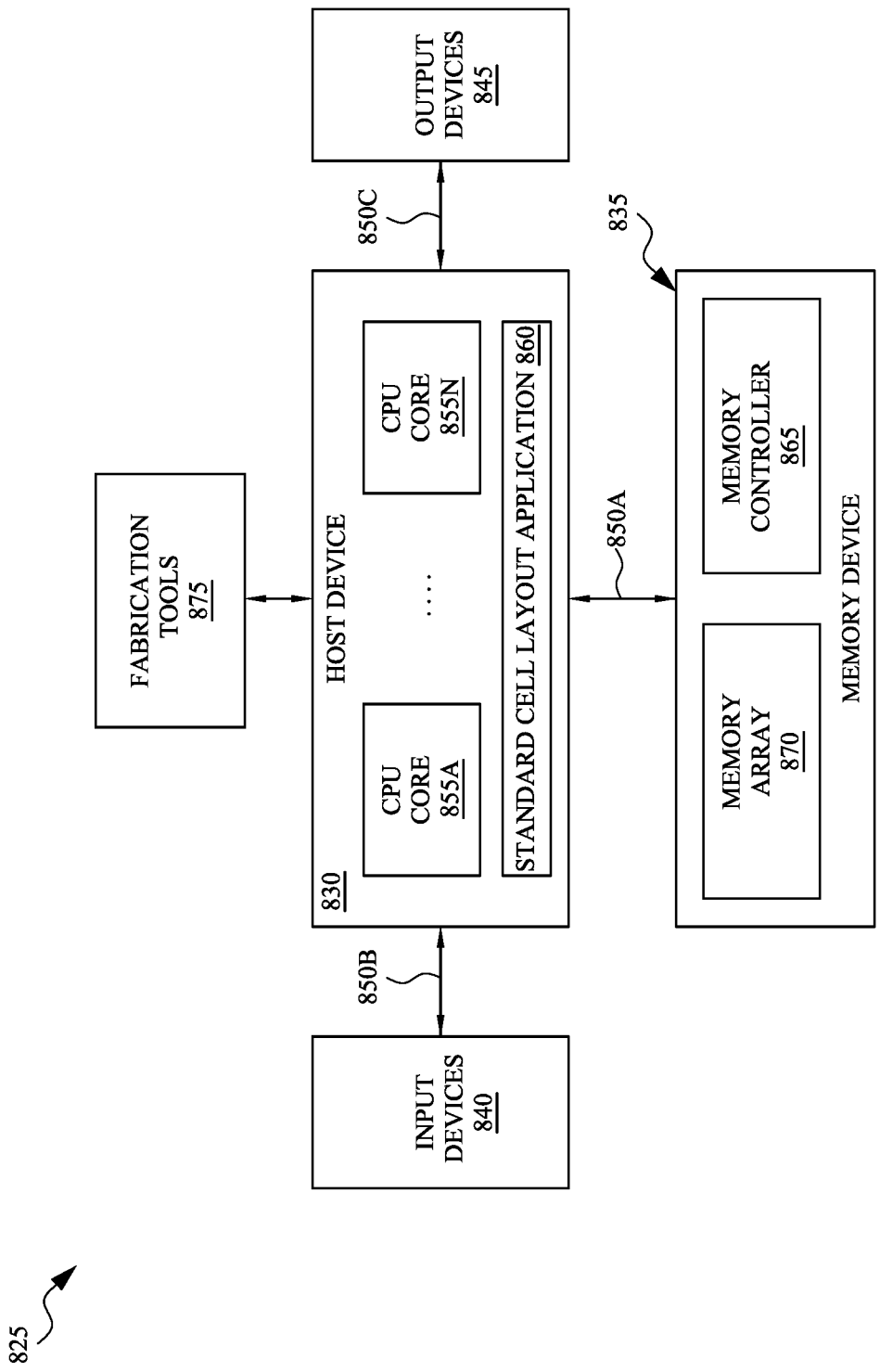
FIG. 11 is an example computing system for creating the standard cell layout designs of FIG. 9, in accordance with some embodiments.

Turning to FIG. 11, an example block diagram of a computing system 825 is shown, in accordance with some embodiments of the disclosure. The computing system 825 may be used by a circuit or layout designer for performing a standard cell layout of a circuit. A "circuit" or "integrated circuit" as used herein is an interconnection of active devices (e.g., electrical components) such as resistors, transistors, switches, batteries, inductors, or other types of semiconductor devices configured for implementing a desired functionality. The computing system 825 includes a host device 830 associated with a memory device 835. The host device 830 may be configured to receive input from one or more input devices 840 and provide output to one or more output devices 845. The host device 830 may be configured to communicate with the memory device 835, the input devices 840, and the output devices 845 via appropriate interfaces 850A, 850B, and 850C, respectively. The computing system 825 may be implemented in a variety of computing devices such as computers (e.g., desktop, laptop, servers, data centers, etc.), tablets, personal digital assistants, mobile devices, other handheld or portable devices, or any other computing unit suitable for performing standard cell layout using the host device 830.

The input devices 840 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 830 and that allows an external source, such as a user (e.g., a circuit or layout designer), to enter information (e.g., data) into the host device and send instructions to the host device. Similarly, the output devices 845 may include a variety of output technologies such as external memories, printers, speakers, displays, microphones, light emitting diodes, headphones, video devices, and any other output peripherals that are configured to receive information (e.g., data) from the host device 830. The "data" that is either input into the host device 830 and/or output from the host device may include any of a variety of textual data, circuit data, signal data, semiconductor device data, graphical data, combinations thereof, or other types of analog and/or digital data that is suitable for processing using the computing system 825.

The host device 830 includes or is associated with one or more processing units/processors, such as Central Processing Unit ("CPU") cores 855A-855N. The CPU cores 8555A-855N may be implemented as an Application Specific Integrated Circuit ("ASIC"), Field Programmable Gate Array ("FPGA"), or any other type of processing unit. Each of the CPU cores 855A-855N may be configured to execute instructions for running one or more applications of the host device 830. In some embodiments, the instructions and data needed to run the one or more applications may be stored within the memory device 835. The host device 830 may also be configured to store the results of running the one or more applications within the memory device 835. Thus, the host device 830 may be configured to request the memory device 835 to perform a variety of operations. For example, the host device 830 may request the memory device 835 to read data, write data, update or delete data, and/or perform management or other operations.

One such application that the host device 830 may be configured to run may be a standard cell layout application 860. The standard cell layout application 860 may be part of a computer aided design or electronic design automation software suite that may be used by a user of the host device 830 to create a standard cell layout (also referred to herein as "layout," "layout diagram," "layout design," and the like) of a circuit. For example, the standard cell layout application 860 may be used to create the layout design 725. A standard cell layout of a circuit may show various components/connections of the circuit to be fabricated. For example, the standard cell layout may show one or more active regions, gate electrodes, source and drain electrodes, metal lines, via contacts, openings for bonding pads, one or more metal layers, power sources, etc. representing the various components of the circuit, and how those components are interconnected when disposed in/on a semiconductor substrate (such as a silicon wafer). The standard cell layout may be implemented by following a design procedure that may include one or more of logic design, physical design, or place and route. The standard cell layout may be expressed in one or more data files such as GDSII file format or DFII file format. In other embodiments, other file formats may be used. Thus, using the standard cell layout application 860, a circuit designer may create a standard cell layout of a circuit. In some embodiments, the instructions needed to execute or run the standard cell layout application 860 may be stored within the memory device 835. The standard cell layout application 860 may be executed by one or more of the CPU cores 855A-855N using the instructions associated with the standard cell layout application from the memory device 835.

Referring still to FIG. 11, the memory device 835 includes a memory controller 865 that is configured to read data from or write data to a memory array 870. In some embodiments, the memory array 870 may include a variety of volatile and/or non-volatile memories. For example, in some embodiments, the memory array 870 may include NAND flash memory cores, NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. Generally speaking, the memory array 870 may include any of a variety of Random Access Memory (RAM), Read-Only Memory (ROM), Programmable ROM (PROM), Erasable PROM (EPROM), Electrically EPROM (EEPROM), hard disk drives, flash drives, memory tapes, optical drives, cloud memory, or any combination of primary and/or secondary memory that is suitable for performing the operations described herein.

The memories within the memory array 870 may be individually and independently controlled by the memory controller 865. In other words, the memory controller 865 may be configured to communicate with each memory within the memory array 870 individually and independently. By communicating with the memory array 870, the memory controller 865 may be configured to read data from or write data to the memory array in response to instructions received from the host device 830. Although shown as being part of the memory device 835, in some embodiments, the memory controller 865 may be part of the host device 830 or part of another component of the computing system 825 and associated with the memory device. The memory controller 865 may be implemented as a logic circuit in either software, hardware, firmware, or combination thereof to perform the functions described herein. For example, in some embodiments, the memory controller 865 may be configured to retrieve the instructions associated with the standard cell layout application 860 stored in the memory array 870 of the memory device 835 upon receiving a request from the host device 830.

In some embodiments, the computing system 825 may also be associated with various fabrication tools 875. Among other things, the fabrication tools 875 may be used to prepare and fabricate a set of masks based on the standard cell layout created by the standard cell layout application 860. The set of masks may define the geometry for the photolithography steps used during semiconductor fabrication of the circuit. Although the fabrication tools 875 are shown separate from the host device 830, in some embodiments, at least some of the functionality of the fabrication tools may be implemented by the host device such as by the standard cell layout application 860 or another application associated with the standard cell layout application.

To prepare a set of masks, the fabrication tools 875 may be used to translate the standard cell layout of the circuit into a representative data file ("RDF"). The RDF may then be used to fabricate a set of physical masks to fabricate the circuit.

In some embodiments, preparing the set of masks may include performing an optical proximity correction (OPC) using lithography enhancement techniques to compensate for image errors, such as those that can arise from diffraction, interference, other process effects and the like, in the standard cell layout. In some embodiments, a mask rule checker (MRC) of the fabrication tools 875 may check the standard cell layout that has undergone processes in OPC with a set of mask creation rules. The mask creation rules may contain certain geometric and/or connectivity restrictions to ensure sufficient margins, to account for variability in semiconductor manufacturing processes, and the like. In some embodiments, the MRC may modify the standard cell layout to compensate for limitations during the fabrication of the set of masks. In some embodiments, preparing the set of masks may also include resolution enhancement techniques (RET), such as off-axis illumination, sub-resolution assist features, phase-shifting masks, other suitable techniques, and the like or combinations thereof.

The preparation of the set of masks may further include, in some embodiments, lithography process checking (LPC) that may simulate processes implemented to fabricate the circuit. LPC may simulate these processes based on the standard cell layout to create a simulated manufactured device of the circuit. LPC may take into account various factors, such as aerial image contrast, depth of focus ("DOF"), mask error enhancement factor ("MEEF"), other suitable factors, and the like or combinations thereof, to simulate the fabrication of the circuit. In some embodiments, after a simulated manufactured device has been created by LPC, if the simulated device does not satisfy certain design rules, OPC and/or MRC may be repeated to further refine the standard cell layout.

To fabricate the set of masks, a mask writer may convert the RDF to an image on a substrate, such as a mask (reticle) or a semiconductor wafer. In some embodiments, an electron-beam (e-beam) or a mechanism of multiple e-beams may be used to form a mask pattern on a semiconductor wafer to form the mask. In some embodiments, the mask pattern may include one or more opaque regions and one or more transparent regions. A radiation beam, such as an ultraviolet (UV) beam, used to expose the image sensitive material layer (e.g., photoresist) which has been coated on the semiconductor wafer, may be blocked by the opaque regions and transmits through the transparent regions. In one example, the mask pattern may include a transparent substrate (e.g., fused quartz) and an opaque material (e.g., chromium) coated in the opaque regions to form the mask. In other embodiments, other or additional techniques may be used to fabricate the masks.

Once the masks are fabricated, a fabrication entity (e.g., a manufacturing facility or semiconductor foundry) may use the fabricated masks to fabricate the circuit. In some embodiments, fabricating the circuit may involve depositing one or material in/on a semiconductor wafer using the mask (or masks). The semiconductor wafer may include a silicon substrate or other substrate having material layers formed thereon. The semiconductor wafer may further include one or more of various doped regions, dielectric features, multilevel interconnects, and the like formed using one or more of the masks.

It is to be understood that although the fabrication tools 875 are described as performing certain operations for preparing the set of masks and then fabricating the set of masks, in some embodiments, the various processes may vary from those described. In some embodiments, additional or other processes or operations may be used to prepare the set of masks and fabricate the set of masks. It is also to be understood that only some components of the computing system 825 are shown and described in FIG. 11. However, the computing system 825 may include other components such as various batteries and power sources, networking interfaces, routers, switches, external memory systems, controllers, etc. Generally speaking, the computing system 825 may include any of a variety of hardware, software, and/or firmware components that are needed or considered desirable in performing the functions described herein. Similarly, the host device 830, the input devices 840, the output devices 845, and the memory device 835 including the memory controller 865 and the memory array 870 may include other hardware, software, and/or firmware components that are considered necessary or desirable in performing the functions described herein.

Thus, the present disclosure provides a write assist cell that is configured to maintain a bit line voltage of a bit line to improve read and write performance. The write assist cell may be embedded within the SRAM array, thereby avoiding any additional periphery transition cost (which may be incurred when the write assist cell is part of the input/output circuits instead) to connect the write assist cell to the SRAM array. Due to being embedded within the SRAM array, in some embodiments, the write assist cell may be embedded at desired bit line locations. For example, the bit lines that are farther away from the input/output circuits may be more susceptible to voltage level variations and may benefit more from the write assist cells. Thus, the write assist cells may be integrated into the SRAM array closer to such bit lines to provide read speed boost and increase read/write margins.

Further, depending upon the voltage adjusting capacity of each write assist cell, a plurality of write assist cells may be connected in each column of the SRAM array. Each write assist cell has a same or similar area footprint as an SRAM cell. Thus, the write assist cell of the present disclosure provides significant area savings compared to conventional write assist cells. The write assist cell of the present disclosure is also content aware (e.g., bit cell content aware during a read or dummy read operation and data aware in a write operation). The write assist cell of the present disclosure is also compatible with NBL designs allowing the bit line to be applied an NVSS voltage to maintain the voltage of the bit line. The write assist cell has a simple control mechanism such that a single enable signal may be used to enable or disable the write assist cell.

In accordance with some aspects of the present disclosure, a memory device is disclosed. The memory device includes a memory array having a plurality of memory cells arranged along a plurality of rows extending in a row direction and a plurality of columns extending in a column direction. The memory array also includes a plurality of write assist cells connected to the plurality of memory cells, such that at least one write assist cell of the plurality of write assist cells is in each of the plurality of columns and connected to respective ones of the plurality of memory cells in a same column. Each of the plurality of write assist cells includes a first transistor, a second transistor, a first access transistor, and a second access transistor such that the first transistor is connected to a first bit line through the first access transistor and the second transistor is connected to a second bit line through the second access transistor.

In accordance with some other aspects of the present disclosure, a write assist cell is disclosed. The write assist cell includes a first transistor having a first terminal connected to ground voltage and a second terminal connected to a first bit line of an SRAM cell, a second transistor having a third terminal connected to the ground voltage and a fourth terminal connected to a second bit line of the SRAM cell, a first access transistor connected between the second terminal and the first bit line, and a second access transistor connected between the fourth terminal and the second bit line. The first access transistor and the second access transistor are controlled by an enable signal. A fifth terminal of the first transistor is connected to the second bit line and a sixth terminal of the second transistor is connected to the first bit line. The write assist cell and the SRAM cell are part of an SRAM array and the SRAM cell is configured to store data during a write operation and the write assist cell is configured to maintain a voltage level of the first bit line during the write operation.

In accordance with yet other aspects of the present disclosure, another write assist cell is disclosed. The write assist cell includes a first transistor having a first terminal connected to ground voltage and a second terminal connected to a first bit line of an SRAM cell, a second transistor having a third terminal connected to the ground voltage and a fourth terminal connected to a second bit line of the SRAM cell, a first access transistor connected between the second terminal and the first bit line, and a second access transistor connected between the fourth terminal and the second bit line. The first access transistor is controlled based upon a voltage level at the second bit line and the second access transistor is controlled based upon the voltage level at the first bit line. A fifth terminal of the first transistor and a sixth terminal of the second transistor are connected to an enable signal, the write assist cell and the SRAM cell are part of an SRAM array, and the SRAM cell is configured to store data during a write operation and the write assist cell is configured to maintain a voltage level of the first bit line during the write operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a memory array comprising:
   a plurality of memory cells arranged along a plurality of rows extending in a row direction and a plurality of columns extending in a column direction; and
   a plurality of write assist cells connected to the plurality of memory cells,
   wherein at least one write assist cell of the plurality of write assist cells is in each of the plurality of columns and connected to respective ones of the plurality of memory cells in a same column;
   wherein each of the plurality of write assist cells comprises:
   a first transistor;
   a second transistor;
   a first access transistor; and
   a second access transistor; and
   wherein the first transistor is connected to a first bit line through the first access transistor and the second transistor is connected to a second bit line through the second access transistor;
   wherein a first subset of memory cells of the plurality of memory cells and a first subset of write assist cells of the plurality of write assist cells are located in the same column, and wherein each memory cell in the first subset of memory cells and each write assist cell in the first subset of write assist cells is connected to the first bit line and the second bit line; and
   wherein the first access transistor is controlled based upon a voltage level of the second bit line and the second access transistor is controlled based upon the voltage level of the first bit line.

2. The memory device of claim 1, wherein each of the plurality of memory cells is a Static Random Access Memory cell.

3. The memory device of claim 1, wherein each write assist cell in the first subset of write assist cells is controlled by a single enable signal line that extends in the column direction.

4. The memory device of claim 1, wherein each write assist cell in the first subset of write assist cells is controlled by a different enable signal line that extends in the row direction.

5. The memory device of claim 1, wherein each write assist cell in the first subset of write assist cells comprises:
a first inverter comprising the first transistor; and
a second inverter comprising the second transistor;
wherein an input of the first inverter is connected to the second bit line and an input of second inverter is connected to the first bit line; and
wherein an output of the first inverter is connected to the first bit line through the first access transistor and an output of the second inverter is connected to the second bit line through the second access transistor.

6. The memory device of claim 1, wherein each write assist cell in the first subset of write assist cells comprises a write assist control cell and at least one write assist driver cell.

7. The memory device of claim 6, wherein the write assist control cell comprises:
the first transistor connected to the first bit line through the first access transistor; and
the second transistor connected to the second bit line through the second access transistor,
wherein the first access transistor and the second access transistor are controlled by an enable signal.

8. The memory device of claim 7, wherein each of the at least one write assist driver cell comprises:
a third transistor connected to the first bit line through a third access transistor, wherein the third transistor is further connected to the enable signal; and
a fourth transistor connected to the second bit line through a fourth access transistor, wherein the fourth transistor is further connected to the enable signal.

9. The memory device of claim 1, wherein each of the plurality of memory cells and each of the plurality of write assist cells has an area footprint of two contacted polysilicon pitch.

10. A write assist cell comprising:
a write assist control cell comprising:
a first transistor comprising a first terminal connected to ground voltage and a second terminal connected to a first bit line of an SRAM cell;
a second transistor comprising a third terminal connected to the ground voltage and a fourth terminal connected to a second bit line of the SRAM cell;
a first access transistor connected between the second terminal and the first bit line; and
a second access transistor connected between the fourth terminal and the second bit line; and
at least one write assist driver cell, each of the at least one write driver cell comprising:
a third transistor comprising a seventh terminal connected to the first bit line and an eighth terminal connected to the ground voltage;
a fourth transistor comprising a ninth terminal connected to the second bit line and a tenth terminal connected to the ground voltage;
a third access transistor between the seventh terminal and the first bit line; and
a fourth access transistor between the ninth terminal and the second bit line
wherein the first access transistor and the second access transistor are controlled by an enable signal;
wherein a fifth terminal of the first transistor is connected to the second bit line and a sixth terminal of the second transistor is connected to the first bit line;
wherein the write assist cell and the SRAM cell are part of an SRAM array;
wherein the SRAM cell is configured to store data during a write operation and the write assist cell is configured to maintain a voltage level of the first bit line during the write operation;
wherein a twelfth terminal of the third transistor and a thirteenth terminal of the fourth transistor are connected to the enable signal;
wherein the third access transistor is controlled based upon a voltage level at the fourth terminal; and
wherein the fourth access transistor is controlled based upon the voltage level at the second terminal.

11. The write assist cell of claim 10, wherein each of the at least one write assist driver cell further comprises:
a fifth transistor connected to the third transistor; and
a sixth transistor connected to the fourth transistor.

12. The write assist cell of claim 10, wherein each of the write assist control cell and each of the at least one write assist driver cell has an area footprint of two contacted polysilicon pitch.

13. The write assist cell of claim 10, further comprising:
a fifth transistor of the write assist control cell connected to the first transistor forming a first inverter; and
a sixth transistor of the write assist control cell connected to the second transistor forming a second inverter.

14. A write assist cell comprising:
a first transistor comprising a first terminal connected to ground voltage and a second terminal connected to a first bit line of an SRAM cell;
a second transistor comprising a third terminal connected to the ground voltage and a fourth terminal connected to a second bit line of the SRAM cell;
a first access transistor connected between the second terminal and the first bit line; and
a second access transistor connected between the fourth terminal and the second bit line,
wherein the first access transistor is controlled based upon a voltage level at the second bit line;
wherein the second access transistor is controlled based upon the voltage level at the first bit line;
wherein a fifth terminal of the first transistor and a sixth terminal of the second transistor are connected to an enable signal;
wherein the write assist cell and the SRAM cell are part of an SRAM array; and
wherein the SRAM cell is configured to store data during a write operation and the write assist cell is configured to maintain a voltage level of the first bit line during the write operation.

15. The write assist cell of claim 14, wherein an area footprint of the write assist cell and the SRAM cell is substantially same.

16. The write assist cell of claim 14, comprising a write assist control cell and at least one write assist driver cell, and wherein the first transistor, the second transistor, the first access transistor, and the second access transistor are part of the write assist control cell.

17. The write assist cell of claim 14, wherein the SRAM cell and the write assist cell each has an area footprint of two contacted polysilicon pitch.

18. The write assist cell of claim 14, further comprising:
a first inverter comprising the first transistor; and
a second inverter comprising the second transistor.

19. The write assist cell of claim 18, wherein an input of the first inverter is connected to the second bit line and an input of second inverter is connected to the first bit line.

20. The write assist cell of claim 18, wherein an output of the first inverter is connected to the first bit line through the first access transistor and an output of the second inverter is connected to the second bit line through the second access transistor.

* * * * *